United States Patent
Ohba et al.

(10) Patent No.: US 6,473,343 B2
(45) Date of Patent: Oct. 29, 2002

(54) SIGNAL AMPLIFICATION CIRCUIT FOR AMPLIFYING AND SENSING CURRENT DIFFERENCE AND SEMICONDUCTOR MEMORY DEVICE INCLUDING SAME

(75) Inventors: Atsushi Ohba, Hyogo (JP); Isao Nojiri, Hyogo (JP); Yoshihide Kai, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/909,968

(22) Filed: Jul. 23, 2001

(65) Prior Publication Data

US 2002/0118576 A1 Aug. 29, 2002

(30) Foreign Application Priority Data

Feb. 26, 2001 (JP) .................................. 2001-049944

(51) Int. Cl.$^7$ ................................................ G11C 7/00
(52) U.S. Cl. ....................... 365/189.07; 365/189.09; 365/207; 365/205; 365/208; 327/51
(58) Field of Search .................. 365/189.07, 189.09, 365/205, 207, 208; 327/51

(56) References Cited

U.S. PATENT DOCUMENTS

| | | | |
|---|---|---|---|
| 4,713,797 A | | 12/1987 | Morton et al. |
| 4,879,682 A | * | 11/1989 | Engles ........................ 327/51 |
| 5,386,158 A | * | 1/1995 | Wang ......................... 327/108 |
| 5,886,546 A | * | 3/1999 | Hwang ........................ 327/103 |
| 6,160,417 A | * | 12/2000 | Taguchi ...................... 326/115 |
| 6,323,693 B1 | * | 11/2001 | Park ............................ 327/52 |

FOREIGN PATENT DOCUMENTS

| | | |
|---|---|---|
| JP | 62-132299 | 6/1987 |
| JP | 62-170099 | 7/1987 |
| JP | 04-212793 | 8/1992 |
| JP | 06-180988 | 6/1994 |

* cited by examiner

*Primary Examiner*—David Nelms
*Assistant Examiner*—Ly D Pham
(74) *Attorney, Agent, or Firm*—McDermott, Will & Emery

(57) ABSTRACT

A signal amplification circuit according to the present invention includes a current comparison part for generating a voltage in accordance with the difference between the reference current and the memory cell current at the first node and an output level setting part for generating an output signal, at the second node. The output level setting part has the first transistor for supplying a constant current in accordance with the control voltage from the power supply node to the second node and the second transistor for allowing the current in accordance with the voltage of the node to flow from the second node to the ground node. The current which flows through the second transistor is designed to be in balance with the constant current under the condition where the reference current and the memory cell current are in balance.

12 Claims, 10 Drawing Sheets

US 6,473,343 B2

SIGNAL AMPLIFICATION CIRCUIT FOR AMPLIFYING AND SENSING CURRENT DIFFERENCE AND SEMICONDUCTOR MEMORY DEVICE INCLUDING SAME

BACKGROUND OF THE INVENTION

1. Field of the Invention

The present invention relates to a signal amplification circuit, in particular, to a sense amplification circuit which is used for data read out of a semiconductor memory device.

2. Description of the Background Art

Conventionally, in a non-volatile semiconductor memory device, or the like, a signal amplification circuit is used which amplifies and senses the difference between currents which flow through two input nodes, respectively, so as to carry out data output in accordance with this current difference. In such a signal amplification circuit, detection sensitivity, detection precision, operational speed, power consumption, and the like, are regarded as important from the viewpoint of performance.

FIG. 14 is a circuit diagram showing the configuration of a signal amplification circuit which is used as a sense amplifier in a non-volatile semiconductor memory device according to a prior art.

Referring to FIG. 14, the signal amplification circuit 1 according to a prior art amplifies the difference between currents which flow through sense input nodes Ni1 and Ni2, respectively, so as to reflect that difference in the signal level of the output signal DOUT.

The sense input node Ni1 is electrically connected to a memory cell transistor MCT via a selection gate YG and a bit line BL at the time of data read out. The memory cell transistor MCT has a control gate which is connected to a word line WL and the source and drain thereof are connected to the ground voltage Vss and the bit line BL, respectively.

The threshold voltage of the memory cell transistor MCT changes in accordance with the level of the stored data (hereinafter referred to as "stored data level"). Accordingly, by activating the word line WL to a predetermined voltage, the threshold voltage of the memory cell transistor MCT, that is to say, a current in accordance with the stored data level, can be made to flow through the memory cell transistor MCT. In general, a plurality of memory cell transistors MCT are selected in response to the activation of one word line WL and a current is made to flow, in accordance with the stored data level, through the plurality of corresponding bit lines, respectively.

The selection gate YG turns on in response to the activation of the column selection line YL. Through a selective activation of the column selection line YL in accordance with the column selection result, one of the plurality of memory cell transistors MCT, which have been selected in response to the. activation of the word line WL, is further selected and is connected to the sense input node Ni1.

In this manner, in response to the selective activation of the word line WL and the column selection line YL, the selected memory cell transistor MCT is electrically connected to the sense input node Ni1.

On the other hand, the sense input node Ni2 is electrically connected, at the time of data read out, to the reference memory cell transistor MCRT for giving the reference value at the time of data read out. The reference memory cell transistor MCRT has a fixed threshold voltage which becomes the reference.

In the same manner, as in the configuration of the memory cell transistor MCT, a word line WRL, a selection gate YGR, a bit line RBL and a column selection line YRL are arranged in the reference memory cell transistor MCRT. The word line WRL and the column selection line YRL are activated at the time of data read out.

The signal amplification circuit 1 amplifies the difference between currents which are, respectively, made to flow through the sense input nodes Ni1 and Ni2 so as to set the signal level of the output signal DOUT.

The signal amplification circuit 1 has an N channel type field effect transistor Ta, a P channel type field effect transistors Tb and Tc which form a current mirror, a diode DC for carrying out a current-voltage conversion and a bias circuit 2. Hereinafter, in the present specification, N channel type field effect transistors and P channel type field effect transistors are also referred to simply as N type transistors and P type transistors.

In response to an enabling signal /EN1 which is inputted to the bias circuit 2, the N type transistor Ta turns on so that the sense input node Ni1 and the gates of the P type transistors Tb and Tc which form the current mirror are electrically connected.

In response to the turning on of the N type transistor Ta, a memory cell current Icell, which corresponds to the stored data level of the selected memory cell transistor MCT, is made to flow through the current path including power supply voltage Vcc, P type transistor Tb, N type transistor Ta, sense input node Ni1, selected memory cell transistor MCT, and ground voltage Vss.

The voltage level of the sense input node Ni1 is maintained, at least, at the threshold voltage of the N type transistor Td, or more, within the bias circuit 2 by means of the effect of the bias circuit 2 The P type transistor Tc which forms the current mirror with the P type transistor Tb allows the inside current Ic in accordance with the memory cell current Icell to flow through the node Nc. The ratio of the memory cell current Icell to the inside current Ic is determined by the ratio of the current driving performance of the P type transistors Tb and Tc, that is to say, the ratio of the transistor size.

The diode DC is formed of an N type transistor which is connected so as to form a diode and generates a voltage, at the node Nc, in accordance with the inside current Ic, which flows through the node Nc.

The signal amplification circuit 1 further includes a bias circuit 3, an N type transistor Te, P type transistors Tf and Tg which form a current mirror and a diode DR.

In response to an enabling signal /EN2 which is inputted to the bias circuit 3, the sense input node Ni2 and the gates of the transistors Tf and Tg which form the current mirror are electrically connected.

In response to the turning on of the N type transistor Te, the reference current Iref, which corresponds to the reference memory cell transistor MCRT, flows through the sense input node Ni2.

The bias circuit 3 operates in the same manner as the bias circuit 2 and maintains the voltage level of the sense input node Ni2 at least at the threshold voltage of the transistor Th, or more.

The same configuration as in the memory cell current Icell is provided for the reference current Iref which flows through the reference memory cell transistor MCRT and the P type transistor Tg which forms the current mirror with the P type transistor Tf allows the inside current Ir in accordance with the reference current Iref to flow through the node Nr. The ratio of the reference current Iref to the inside current Ir is determined by the ratio of the current driving performance of the P type transistors Tf and Tg, that is to say, the ratio of the transistor size.

The diode DR is formed of an N type transistor which is connected so as to form a diode in the same manner as in the diode DC and generates a voltage in accordance with the reference current Iref at the node Nr.

The signal amplification circuit 1 further includes a differential amplifier 4.

The differential amplifier 4 amplifies the voltage difference between the nodes Nc and Nr and sets the signal level of the output signal DOUT within the range between the power supply voltage Vcc and the ground voltage Vss. The configuration of the differential amplifier 4 is generic, of which the detailed description is omitted.

In such a configuration, a memory cell current Icell which flows through the selected memory cell transistor MCT is compared with the reference current Iref which flows through the reference memory cell transistor MCRT so that the output signal DOUT in accordance with the stored data level of the memory cell transistor MCT can be outputted. Accordingly, data read out of a non-volatile semiconductor memory device is possible by using such a signal amplification circuit 1.

In the signal amplification circuit 1 according to the prior art, however, respective currents which are inputted into the sense input nodes Ni1 and Ni2 are once converted to voltages so that data read out is carried out through the comparison between these converted voltages.

In general, the above described voltage difference in the case of the usage for the data read out of a non-volatile semiconductor device, that is to say, the voltage difference between the nodes Nc and Nr in FIG. 14 becomes a comparatively microscopic value. Thereby, it becomes necessary to carry out a voltage amplification by providing a differential amplifier 4.

In addition, in recent years, a multi level cell, or the like, which stores not only one bit information showing either "1" or "0" but also information of a plurality of bits in one memory cell has been developed and in this case a current difference to be sensed can be set at a further smaller value.

Though in this case, it becomes necessary to secure a gain in the data read out by increasing the number of stages of differential amplifiers, or the like, the increase of the number of stages of the differential amplifiers causes the problems such as a delay of the operational speed or an increase of the current consumption.

In order to solve such problems, a configuration of a sense amplifier is disclosed, for example, in FIG. 1 of the gazette of Japanese Patent Laying-Open No. 6-180988(1994), where a voltage in accordance with the comparison result of currents inputted to the sense input nodes is directly generated so as to carry out the data output based on this voltage.

In the sense amplifier disclosed in the above gazette, however, the voltage generated through the comparison of the input currents is received by a mere inverter at the final stage so as to carry out the data output. Therefore, there is a possibility that it will become difficult to maintain the corresponding relationships, between the comparison result of the input currents and the outputted data level, at a constant level while removing the influence of a disturbance.

For example, a fluctuation of the operational power supply voltage. can be cited as a representative example of such a disturbance. That is to say, the threshold value of the inverter at the final stage, that is to say, an input voltage level to the above inverter, which corresponds to the switching point of the output level of said inverter, is necessary to be set to correspond to the condition where the input currents are equal and, on the other hand, the threshold value of the inverter fluctuates by receiving the influence of the operational power supply voltage. As a result of this, the output from the above inverter cannot precisely reflect the comparison result between the currents which are the detection objectives and there is a possibility that the precision of the data read out will deteriorate.

In particular, in recent years, a lower voltage operation has been achieved, from the viewpoint of lower power consumption, of a semiconductor device and there is the concern that the fluctuation of the operational power supply voltage has a great impact on the precision of the data read out.

SUMMARY OF THE INVENTION

The purpose of this invention is to provide a signal amplification circuit, for amplifying and sensing the difference between input currents which can prevent the deterioration of data read out due to disturbance, and to provide a semiconductor memory device including the same.

This invention concisely described is a signal amplification circuit for amplifying and sensing the difference between the input current and the reference current which flow through the first and the second input nodes, respectively, which includes a reference voltage generation part, a first transistor, a current comparison part and an output level setting part. The reference voltage generation part generates a reference voltage at a first node in accordance with the reference current. The first transistor is of a first conductive type and is electrically connected between a first power supply node, which supplies a first voltage, and the first input node so as to allow the input current to pass through it. The current comparison part generates a voltage in accordance with the difference between the input current and the reference current at a second node based on the reference voltage. The current comparison part includes a second transistor of the. first conductive type and a third transistor of a second conductive type, which is an opposite conductive type to the first conductive type. The second transistor is electrically connected between the first power supply node and the second node and forms a current mirror with the first transistor. The third transistor has a control electrode which receives the input of the reference voltage and is electrically connected between a second power supply node to which the second voltage is supplied, and the second node. The output level setting part outputs a voltage in accordance with a sensing result at the output node in accordance with the voltage of the second node. The output level setting part includes a fourth transistor of the first conductive type, which is electrically connected between the first power supply node and the output node and which has a control electrode that receives a voltage in accordance with the reference voltage as well as a fifth transistor of the second conductive type, which is electrically connected between the output node and the second power supply node and has a control electrode which is connected to the second node. Under the condition where the input current and the reference current are equal, currents which flow through the fourth and the fifth transistors, respectively, are in balance.

Accordingly, the main advantage of this invention is that the voltage dependency with the first or the second power supply node is reduced so that the threshold of the data read out can be set in a stable manner to correspond to the condition where the reference current and the input current are imbalance. As a result, the occurrence of detection error due to the fluctuation of the power supply voltage can be prevented.

According to another aspect of this invention, a semiconductor memory device including a plurality of memory cells, a reference memory cell, a selection part and a sense amplification circuit are provided. A current amount in accordance with the level of the stored data is made to flow through one of a plurality of memory cells at the time of data read out. A current amount which becomes the reference of the data read out is made to flow through the reference memory cell. The selection part electrically connects one of the plurality of the memory cells which has been selected as the objective of the data read out as well as the reference memory cell to the first and the second sense input nodes, respectively, in the data read out. The sense amplification circuit amplifies and senses the difference between the input current and the reference current which respectively flows through a first and second sense input nodes. The sense amplification circuit includes a reference voltage generation part for generating a reference voltage at a first node in accordance with the reference current, a first transistor of a first conductive type which is electrically connected between a first power supply node that supplies a first voltage and a first input node so as to allow the input current to pass through and a current comparison part for generating a voltage in accordance with the difference between the input current and the reference current at a second node. The current comparison part has a second transistor of the first conductive type that is electrically connected between the first power supply node and the second node and forms a current mirror with the first transistor as well as a third transistor, of a second conductive type that is the opposite conductive type of the first conductive type, that has a control electrode which receives an input of the reference voltage and is electrically connected between a second power supply node which supplies a second voltage and a second node. The sense amplification circuit further includes an output level setting part for outputting the read out data which has a voltage in accordance with a sensing result to the output node in accordance with the voltage of the second node. The output level setting apart has a fourth transistor of the first conductive type, which is electrically connected between the first power node and the output node and which has a control electrode which receives an input of the voltage in accordance with the reference voltage as well as a fifth transistor of the second conductive type, which is electrically connected between the output node and the second power supply node and which has a control electrode connected to the second node. Under the condition where the input current and the reference current are equal, currents which respectively flow through the fourth and the fifth transistors are in balance.

Accordingly, a semiconductor memory device can be provided which includes, as a sense amplification circuit, a signal amplification circuit which allows the threshold of the data read out to be stably set by corresponding to the condition where the reference current and the input current are in balance while removing the voltage dependability of the first or the second power supply node. Accordingly the precision of the data read out due to the fluctuation of the power supply voltage can be prevented from deteriorating.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
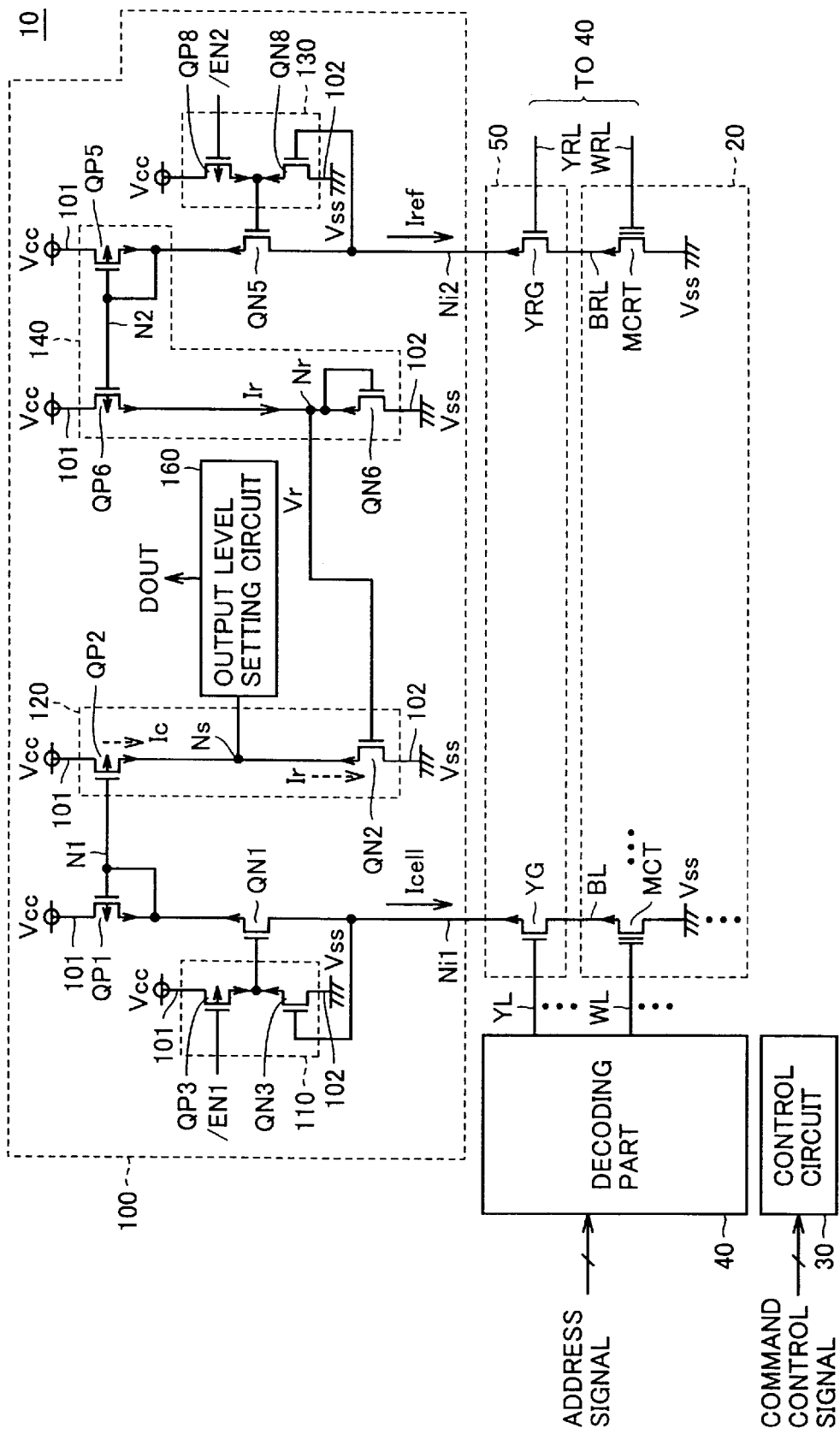
FIG. 1 is a block diagram showing the configuration of a non-volatile semiconductor memory device which includes a sense amplification circuit as a representative example of a signal amplification circuit according to a first embodiment of the present invention.

In the following, embodiments of the present invention are described in detail referring to the drawings. Here, the same symbols in the figures show the same or the corresponding parts.

First Embodiment

Referring to FIG. 1, a non-volatile semiconductor memory device 10, which includes a signal amplification circuit in accordance with the first embodiment of the present invention, comprises a memory array 20, a control circuit 30, a decoding part 40 and a selection circuit 50.

The memory array 20 includes a plurality of memory cell transistors MCT, which are arranged in a matrix form, and at least one reference memory cell transistor MCRT. Each of the memory cell transistors MCT stores data in a non-volatile manner and has a threshold voltage in accordance with the stored data level.

Word lines and bit lines are, respectively, arranged to correspond to rows and columns of the memory cell transistors MCT. FIG. 1 shows the arrangement of a word line WL and a bit line BL for one memory cell transistor MCT, which is representatively shown. The memory cell transistor MCT has a control gate which is connected to the corresponding word line WL.

At the time of data read out, a current in accordance with the stored data level in a memory cell transistor, which is selected in accordance with the activation of the word line WL to a predetermined voltage, can be made to flow between the source and the drain of the memory cell transistor MCT.

The reference memory cell transistor MCRT is provided for generating the reference current at the time of data read out and has a preset threshold voltage. In FIG. 1, the word line and the bit line which are arranged so as to correspond to the reference memory cell transistor MCRT are denoted respectively by the symbols WRL and BRL.

In the present invention, the arrangement of the reference memory cell transistor MCRT is not particularly imitative and, for example, it is possible to arrange either one of the word line WRL and the bit line BRL so as to share a row or a column with a memory cell transistor MCT so as to be shared with a word line WL or a bit line BL which are arranged for a memory cell transistor MCT. It is possible to provide the reference memory cell MCRT separately from memory array 20, too.

By activating the word line WRL to a predetermined voltage, the reference current at the time of data read out can be made to flow through the reference memory cell transistor MCRT.

The control circuit 30 controls the entire operation of the non-volatile semiconductor memory device 10 in accordance with a command control signal inputted from the outside. The decoding part 40 selectively activates a word line WL and a column selection line YL in accordance with an address signal for selecting a memory cell transistor MCT arranged in a matrix form within the memory array 20. The selective activation of the word line WRL and the column selection line YRL, which are provided so as to correspond to the reference memory cell transistor, can also be carried out in the decoding part 40.

The selection circuit 50 electrically connects a bit line BL which corresponds to a memory cell column selected in accordance with the column selection result and the bit line BRL to the sense input nodes Ni1 and Ni2, respectively. As a result of this, a memory cell transistor MCT which has been selected in accordance with the address signal and the reference memory cell transistor MCRT are electrically connected to the sense input node Ni1 and Ni2, respectively, at the time of data read out in the non-volatile semiconductor memory device 10.

The non-volatile semiconductor memory device 10 further comprises a sense amplification circuit 100 which amplifies the difference between currents which flow through the sense input nodes Ni1 and Ni2, respectively, so as to generate an output signal DOUT. The sense amplification circuit 100 is shown as a representative example of a signal amplification circuit according to the present invention.

The sense amplification circuit 100 includes an N type transistor QN1, a bias circuit 110, a P type transistor QP1 and a P type transistor QP2 as well as an N type transistor QN2 which form a current comparison part 120.

The N type transistor QN1 turns on in response to the activation (L level) of the enabling signal /EN1 which is inputted via the bias circuit 110 and is electrically connected between the sense input node Ni1 and the node N1.

The bias circuit 110 has a P type transistor QP3 and an N type transistor QN3 which are electrically connected in series between the power supply node 101 which supplies the power supply voltage Vcc and the ground node 102 which supplies the ground voltage Vss. The P type transistor QP3 is electrically connected between the power supply node 101 and the gate of the N type transistor QN1, and receives the enabling signal /EN1 at the gate. The N type transistor QN3, of which the gate is connected to the sense input node Ni1, is electrically connected between the gate of the N type transistor QN1 and the ground node 102.

The P type transistor QP1 is electrically connected between the power supply node 101 and the node N1 and has a gate which is connected to the node N1.

The current comparison part 120 has a P type transistor QP2 which is electrically connected between the power supply node 101 and the node Ns and which has a gate connected to the node N1 as well as an N type transistor QN2 which is electrically connected between the ground node 102 and the node Ns and which has a gate connected to the node Nr.

Since the P type transistors QP1 and QP2 form a current mirror, an internal current Ic, which flows through the sense input node Ni1 in accordance with the memory cell current Icell, tends to flow through the P type transistor QP2. The ratio of the memory cell current Icell to the internal current Ic is determined by the ratio of the current driving performance between the P type transistors QP1 and QP2, that is to say, the ratio of the transistor size.

The signal amplification circuit 100 further includes an N type transistor QN5, a bias circuit 130 and a reference voltage generation part 140.

The N type transistor QN5 turns on in response to the activation (L level) of the enabling signal /EN2 which is inputted via the bias circuit 130 and is electrically connected between the sense input node Ni2 and the node N2.

The bias circuit 130 has a P type transistor QP8 and an N type transistor QN8 which are electrically connected in series between the power supply node 101 and the ground node 102. The P type transistor QP8 is electrically connected between the power supply node 101 and the gate of the N type transistor QN5 and receives the enabling signal /EN2 at the gate. The N type transistor QN8, of which the gate is connected to the sense input node Ni2, is electrically connected between the gate of the N-type transistor QN5 and the ground node 102.

The reference voltage generation part 140 has a P type transistor QP5, a P type transistor QP6 and an N type transistor QN6.

The P type transistor QP5 is electrically connected between the power supply node 101 and the node N2 and has a gate connected to the node N2. The P type transistor QP6 is electrically connected between the power supply node 101 and the node Nr and has a gate connected to the node N2. The P type transistor QP6 forms a current mirror with the P type transistor QP5.

The N type transistor QN6, of which the gate is connected to the node Nr, is electrically connected between the node Nr and the ground node 102.

Accordingly, an internal current Ir in accordance with the reference current Iref, which flows through the sense input node Ni2, is supplied to the node Nr in the reference voltage generation part 140. The ratio of the reference current Iref to the internal current Ir is determined by the ratio of the current driving performance between the P type transistors QP5 and QP6, that is to say, the ratio of the transistor size.

In addition, the reference voltage Vr in accordance with the internal current Ir is generated at the node Nr by means of the N type transistor QN6 which is connected so as to form a diode.

The characteristics of respective transistors within the sense amplifier circuit 100 are designed so that the ratio of the internal current Ic to the memory cell current Icell and the ratio of the internal current Ir to the reference current Iref have the same value. That is to say, the ratio of the current driving performance (transistor size) between the P type transistors QP1 and QP2 and the ratio of the current driving performance (transistor size) between the P type transistor QP5 and QP6 are designed to be the same. In addition, the current driving performances (transistor sizes) of the N type transistors QN2 and QN6 are designed to be the same.

Thereby, the memory cell current Icell can be sensed and found to be larger/smaller than the reference current Iref, through the comparison of the internal currents Ir and Ic.

The sense amplifier circuit 100 further includes an output level setting circuit 160 for setting the signal level of the output signal DOUT in accordance with the voltage level of the node Ns.

The output level setting circuit 160 sets the voltage of the node Ns (hereinafter also referred to as "output threshold"), which corresponds to the border point between the H level and the L level in the output signal DOUT, so as to correspond to the condition where the memory cell current Icell and the reference current Iref, which are inputted to the sense amplifier circuit 100, are equal.

Next, the operation of the sense amplifier circuit 100 is described.

In response to the activation of the enabling signal /EN1, the current path including power supply node 101, P type transistor QP1, N type transistor QN1, sense input node Ni1 and memory cell transistor MCT is formed so that the memory cell current Icell in accordance with the stored data level of the selected memory cell transistor MCT is made to flow through the sense input node Ni1.

The voltage level of the sense input node Ni1 is set at least at the threshold voltage, or more, of the N type transistor QN3 by the bias circuit 110. Thereby, the amplification operation in the sense amplifier circuit 100 can be implemented in a region where the gain is stable.

The internal current Ir tends to flow through the P type transistor QP2 in accordance with the memory cell current Icell by means of the current mirror formed of the P type transistors QP1 and QP2.

On the other hand, on the side of the reference memory cell, the same operation is carried out so that the reference voltage generation part 140 allows the internal current Ir in accordance with the reference current Iref to flow through the node Nr and, thereby, generates the reference voltage Vr in accordance with the reference current Iref at the node Nr.

The N type transistor QN2 within the current comparison part 120 has a gate connected to the node Nr. Accordingly, the characteristics of the N type transistors QN2 and QN6 are designed to be the same so that the same current as the internal current Ir can be made to flow through the N type transistor QN2.

That is to say, at the time of data read out, one of the internal currents Ir or Ic of which the current amount is smaller flows through the node Ns. In addition, the voltage of the node Ns is set in accordance with the difference between the internal current Ic which tends to flow through the P type transistor QP2 and the internal current Ir which tends to flow through the N type transistor QN2 by means of the push-pull operations of the P type transistor QP2 and the N type transistor QN2.

Figure 2:
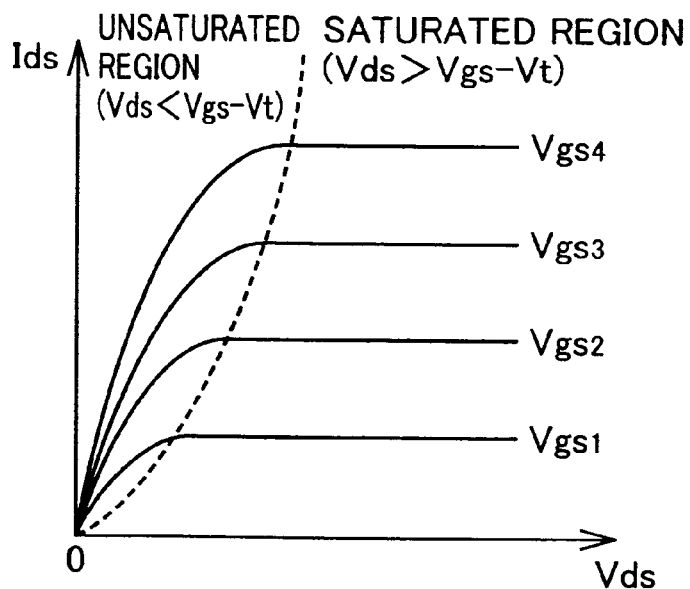
FIG. 2 is a diagram showing a generic operational characteristics of an N type transistor.

Referring to FIG. 2, the operation region of the N type transistor is divided into an unsaturated region, where the drain current Ids changes in accordance with the voltage Vds between the source and the drain, and a saturated region, where the drain current Ids is not affected by the voltage Vds between the source and the drain, so as to change in accordance with the voltage Vgs between the gate and the source.

As shown in FIG. 1 the push-pull operation is carried out in the current comparison part 120 by means of the N type transistor QN2 and the P type transistor QP2 so that the change of the drain current in accordance with the stored data level is reflected in the voltage of the node Ns and, thereby, the current difference between the memory cell current Icell and the reference current Iref is detected. The voltage level of the node Ns corresponds to the voltage between the source and the drain of the N type transistor QN2.

Accordingly, the voltage of the node Ns, which corresponds to the change of the drain current, can be greatly changed by making the N type transistor QN2 and the P type transistor QP2 operate in the saturated region. That is to say, the amplification gain can be enhanced.

Therefore, it is preferable to design the current driving performances, that is to say, the transistor sizes, of the P type transistor QP2 and the N type transistor QN2 so that these transistors can operate in the saturated region.

Figure 3:
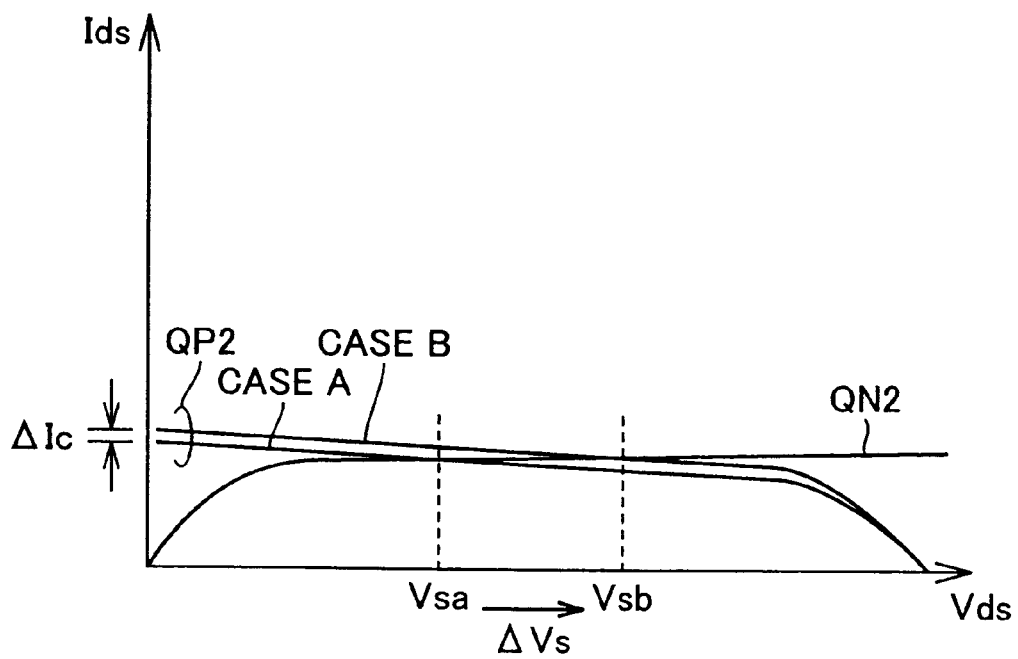
FIG. 3 is a schematic view for describing the operation of a current comparison part.

Referring to FIG. 3, the horizontal axis shows the voltage Vds between the source and the drain of the transistors QN2 and QP2. The vertical axis shows the drain current Ids of the transistors QN2 and QP2.

Since the reference current Iref is a reference value which is preset in a fixed manner in FIG. 3, the characteristic curve of the N type transistor QN2 is constant, without depending on the stored data which are read out, at the time of data read out.

On the other hand, the current-voltage characteristics of the P type transistor QP2 change in accordance with the stored data level of the selected memory cell transistor MCT. That is to say, in FIG. 3, in response to the difference in the stored data level of the selected memory cell transistor MCT, two cases are shown: where the memory cell current Icell is small (case A) and where the memory cell current Icell is large (case B).

In respective cases, the voltages of the node Ns are shown as the voltages Vsa and Vsb, which correspond to the intersections between the voltage-current characteristic lines of the N type transistor QN2 and the P type transistor QP2. Accordingly, even in the case that the difference $\Delta$Ic in the internal current between the case a and the case b is microscopic, the voltage difference $\Delta$Vs in the node Ns can be made comparatively large.

In this manner, by making the P type transistors QP2 and QN2, which form the current comparison part 120, carry out the push-pull operation in accordance with the internal currents Ic and Ir, which correspond to the memory cell current Icell and the reference current Iref, respectively, the microscopic change of the memory cell current Icell can be reflected in the voltage level of the node Ns as a large voltage change.

Figure 14:
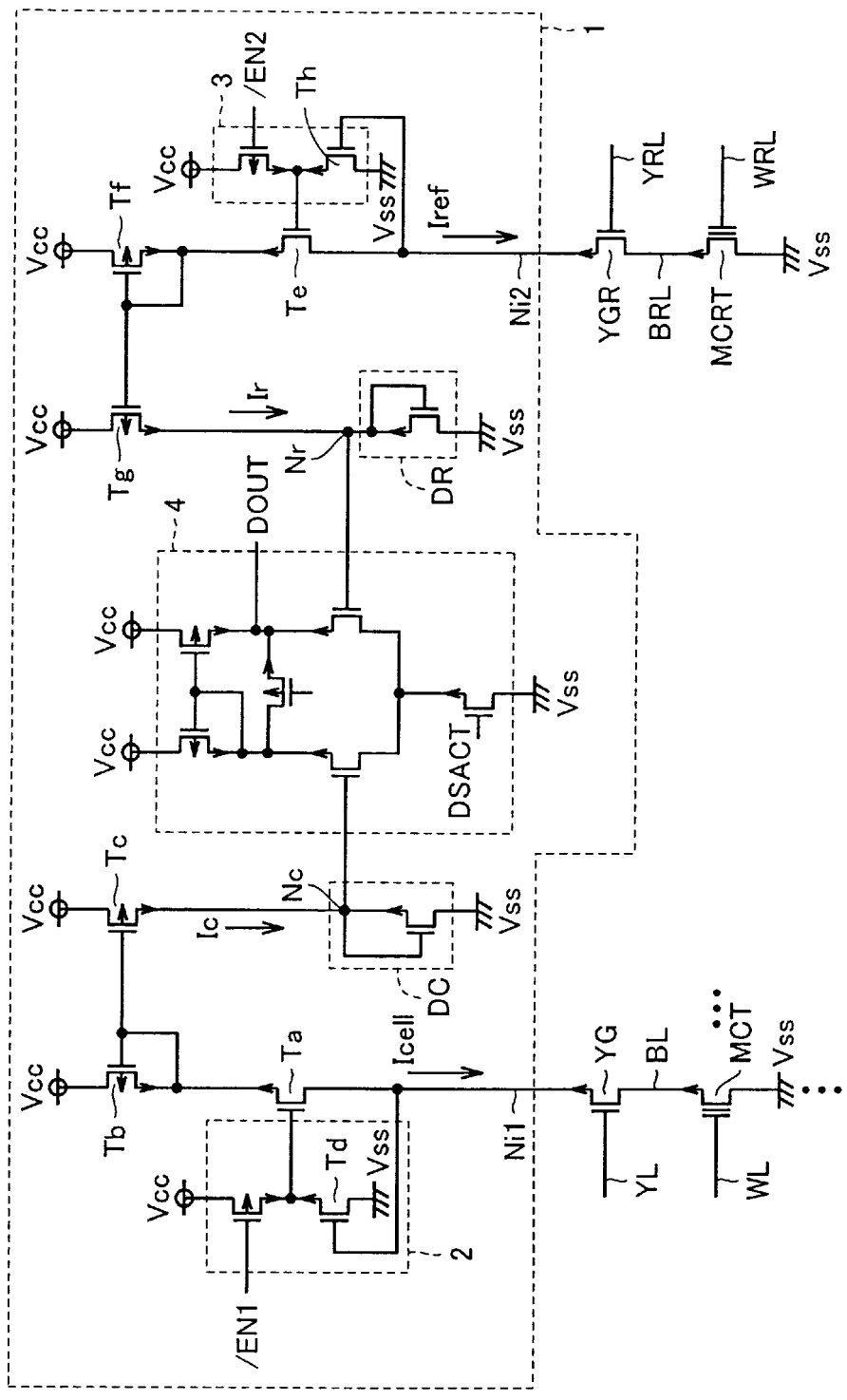
FIG. 14 is a circuit diagram showing the configuration of a signal amplification circuit according to a prior art.

In such a circuit configuration, the amplification operation can be carried out without providing a differential amplifier 4 as shown in FIG. 14 and, therefore, power consumption and operation time in a differential amplifier become unnecessary so that a lower power consumption and a higher speed of current operation can be achieved. In addition, only one, the smaller, of the internal currents Ic and Ir flows through the current comparison part 120 so that the power consumption can be further restricted.

Next, the configuration of the output level setting circuit 160 is described.

Figure 4:
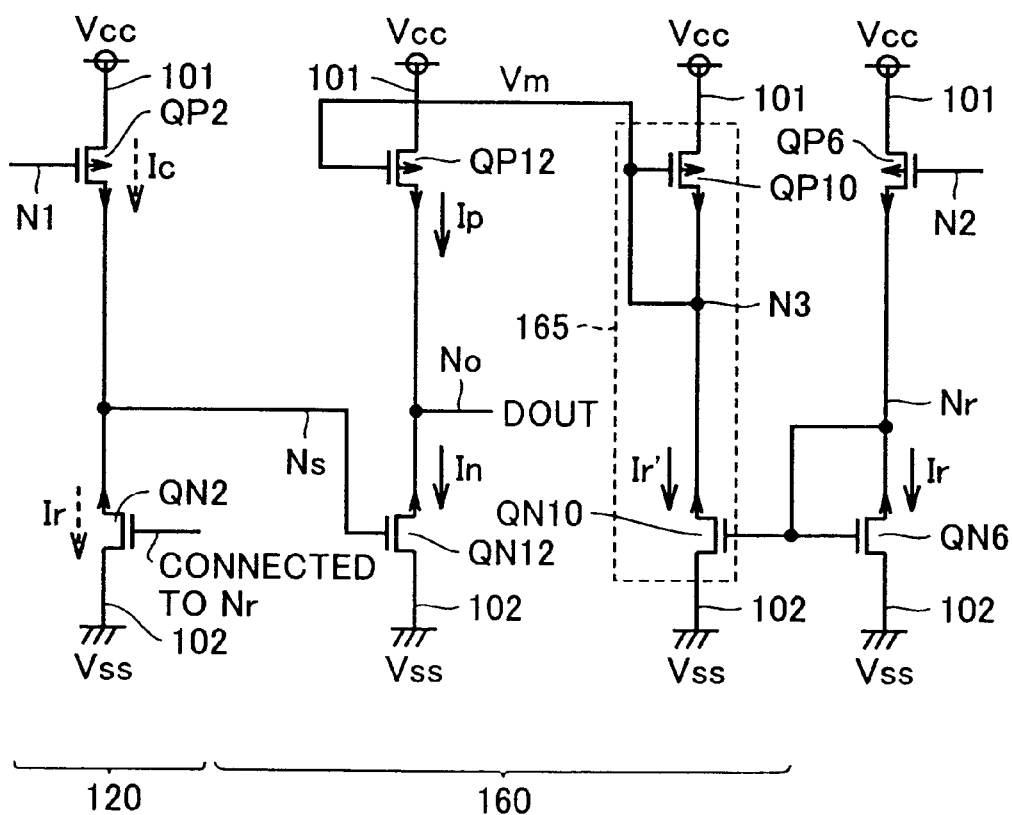
FIG. 4 is a circuit diagram showing a configuration example of an output level setting circuit.

Referring to FIG. 4, the output level setting circuit 160 has a control voltage generation part 165, a P type transistor QP12 and an N type transistor QN12.

The control voltage generation part 165 generates the control voltage Vm, in accordance with the voltage of the node Nr, at the node N3. The control voltage generation part 165 has an N type transistor QN10 which is electrically connected between the node N3 and the ground node 102 and a P type transistor QP10 which is electrically connected between the power supply node 101 and the node N3.

The gates of the N type transistors QN10 and QP10 are connected to the nodes Nr and N3, respectively. Thereby, the N type transistor QN10 forms a current mirror with the N type transistor QN6 within the reference voltage generation part 140 and, therefore, the current Ir' which flows through the N type transistor QN10 is set in accordance with the reference current Iref.

As a result of this, the control voltage Vm generated at the node Nm is determined in accordance with the voltage of the node Nr, that is to say, the reference current Iref.

In the configuration of FIG. 4, the transistor sizes of the N type transistors QN6 and QN10 are designed in the same manner and the control voltage Vm is at the same level as the reference voltage Vr generated at the node Nr.

The P type transistor QP 12 supplies a constant current Ip in accordance with the control voltage Vm to the output node No to which the output signal DOUT is outputted. On the other hand, the gate of the N type transistor QN12 is connected to the node Ns.

Here, the operation wherein the output level setting circuit 160 is under the condition where the memory cell current Icell and the reference current Iref are equal is assumed. In this case, the internal current Ic on the side of the memory cell and the internal current Ir on the side of the reference memory cell become equal so that the currents, which flow through the N type transistors QN2 and QN6, respectively, become equal.

In addition, the gates of the N type transistors QN2 and QN6 are both connected to the node Nr so that their gate voltages are also equal. Accordingly, the drain voltages of the N type transistors QN2 and QN6 become equal. By designing the current In which flows through the N type transistor QN12 in this condition (Icell=Iref) so as to be in balance with the current Ip which flows through the P type transistor QP12, the output threshold of the data read out is made to stably correspond to the condition of "memory cell current (Icell)=reference current (Iref)" so that the detection error due to the fluctuation of the power supply voltage Vcc, that is to say the occurrence of the data read out, can be prevented.

In the configuration of FIG. 4, the current driving performances (transistor sizes) of the N type transistor QN10 and the P type transistor QP10, which form the control voltage generation part 165, may be designed so as to have the relationship of QP10:QP12=QN2:QN12, taking the transistor sizes of the N type transistors QN12 and QN2 into consideration. In accordance with the configuration where the output threshold is maintained in accordance with the current driving performance ratio (transistor size ratio) in this manner, the negative effects to the detection precision, by the dispersion of individual transistor characteristics which occurs at the time of production, can be restricted.

In addition, in the condition where the memory cell current Icell and the reference current Iref are equal, the drain voltages of the P type transistors QP2 and QP6 which correspond to the memory cell current Icell and the reference current Iref, respectively, and which form a current mirror are also set at the same level. Accordingly, even in the case that the fluctuation of the power supply voltage Vcc occurs, no detection errors due to the fluctuation of the drain voltages of the P type transistors QP2 and QP6 occur.

Figure 5A:
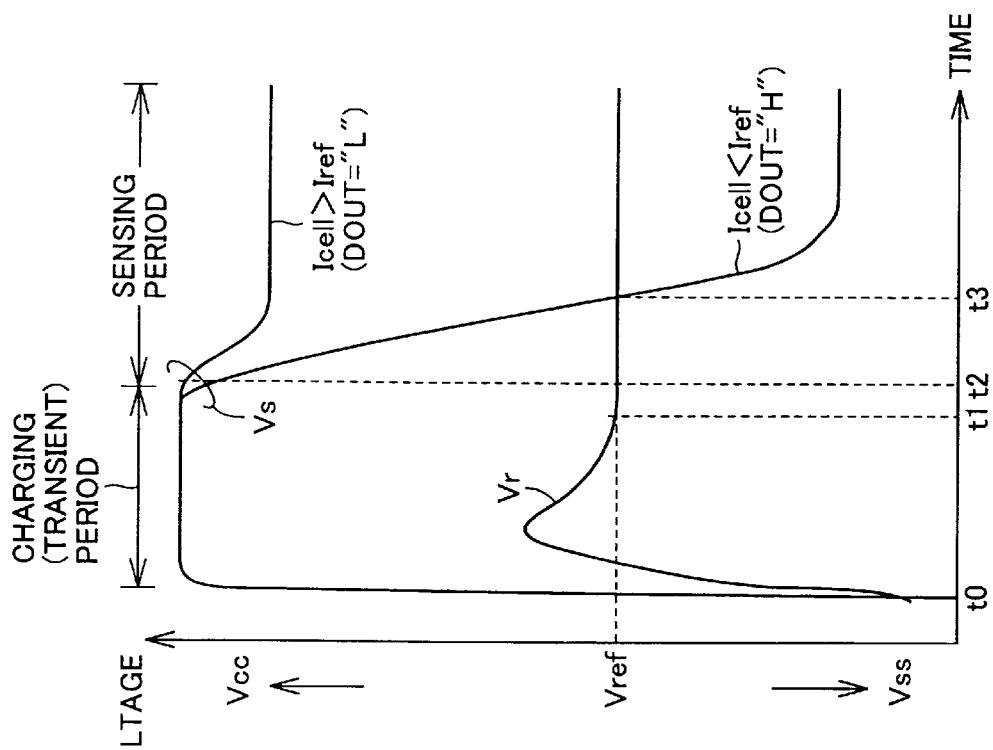
FIGS. 5A and 5B are timing charts for describing the operation of the sense amplification circuit as a representative example of a signal amplification circuit according to the first embodiment of the present invention.

FIG. 5A shows transitions of the memory cell current Icell and the reference current Iref at the time of data read out.

When the data read out is started in response to the activation of the enabling signals /EN 1 and /EN2 at the time t0, the selected memory cell transistor MCT and the reference memory cell transistor MCRT are connected to the sense input nodes Ni1 and Ni2 of the sense amplifier circuit 100, respectively, so that the memory cell current Icell and the reference current Iref start flowing.

Since parasitic capacitances and wire resistances exist along the current transmission paths for the memory cell current Icell and the reference current Iref including the bit lines BL, BRL, and the like, a transitional condition period exists where these current transmission paths are, first of all, charged by the memory cell current Icell and the reference current Iref after the start of data read out. Hereinafter, such a period is also referred to as "charging period."

In general, the parasitic capacitance and the wire resistance in the current transmission path for the reference current Iref are smaller than. those of the current transmission path of the memory cell current. Accordingly, the current peak value during the charging period and the time required for completing the charge of the memory cell current Icell are larger and longer than those of the reference current Iref.

Therefore, the charge completion time t1 of the reference current Iref is earlier than the charge completion time t2 of the memory cell current Icell as shown in FIG. 5A.

When the charging period is completed, the reference current Iref converges at a predetermined design value level. On the other hand, the memory cell current Icell settles at the current value in accordance with the stored data level of the memory cell transistor MCT which has been selected as the objective of data read out.

Accordingly, after the completion of the charging period where the charges of the respective current transmission paths have been completed, a microscopic current difference between the memory cell current Icell and the reference current Iref occurs to correspond to the stored data level of the data read out objective.

Figure 5B:
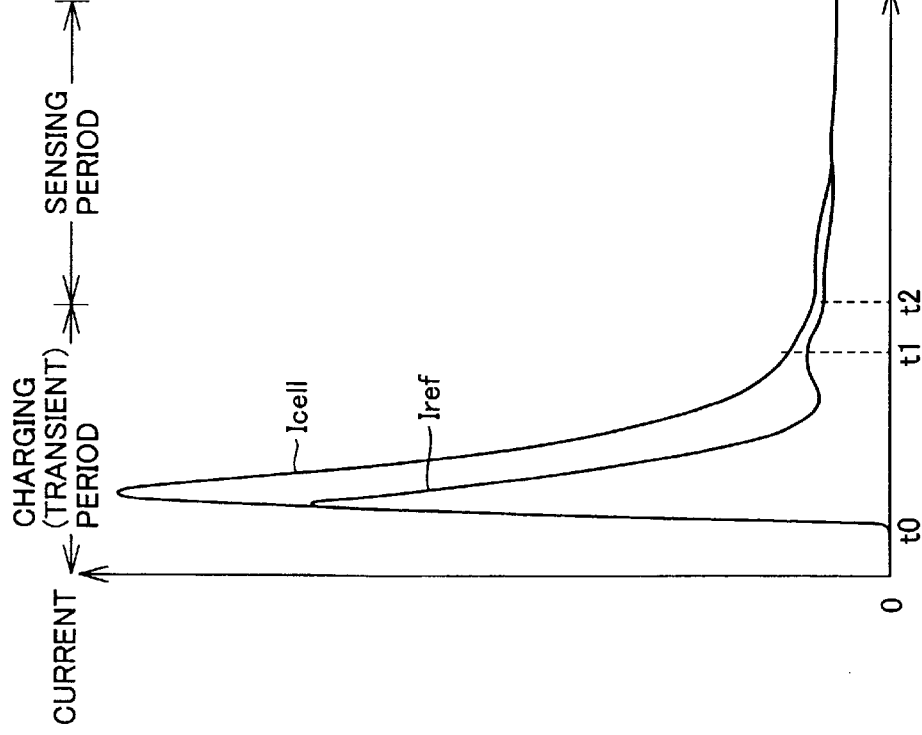

As shown in FIG. 5A, hereinafter the period where such a current difference occurs and the data read out becomes practically possible by the sense amplifier circuit 100 is also referred to as "sensing period." FIG. 5B shows the voltage transition of the output signal DOUT of the sense amplifier circuit 100.

Referring to FIG. 5B, in the transitional charging period, the memory cell current Icell is larger than the reference current Iref as is already described and, therefore, the condition is gained where the voltage Vn of the node Ns acts in accordance with the power supply voltage Vcc. Though, the reference voltage Vr of the node Nr once rises through the charge of the current transmission path for the reference current Iref, it converges to a predetermined voltage Vref together with the convergence of the reference current Iref (time t1).

On the other hand, the voltage level Vs of the node Ns shifts to either the condition of case A (Vs<Vref) or case B (Vs>Vref), in accordance with the relationship of larger/smaller between the memory cell current Icell and the reference current Iref, while the memory cell current Icell converges after the charging of the current transmission path is completed.

As already described, the output level setting circuit 160 sets a predetermined voltage Vref which corresponds to a constant value of the reference voltage Vr as shown in FIG. 5B as the output threshold of the data read out.

Accordingly, in the case of Icell<Iref, the output signal DOUT switches from the L level to the H level according to the timing (time t3) where the voltage Vs of the node Ns is lower than the predetermined voltage Vref On the other hand, in the case of Icell>Iref, the output signal DOUT does not change and stays at the L level.

In this manner, in the sense amplifier circuit 100 according to the first embodiment, a current difference between the inputted memory cell current Icell and the reference current Iref can be sensed and amplified, without having the voltage amplification operation by a differential amplifier together, at a high speed and with a low power consumption so as to generate an output signal DOUT.

In addition, since the output threshold of the data read out can be maintained so as to correspond to the condition: memory cell current (Icell)=reference current (Iref), the data read out can be carried out with precision while maintaining the detection precision by removing the effect of the fluctuation of the power supply voltage Vcc.

Figure 6:
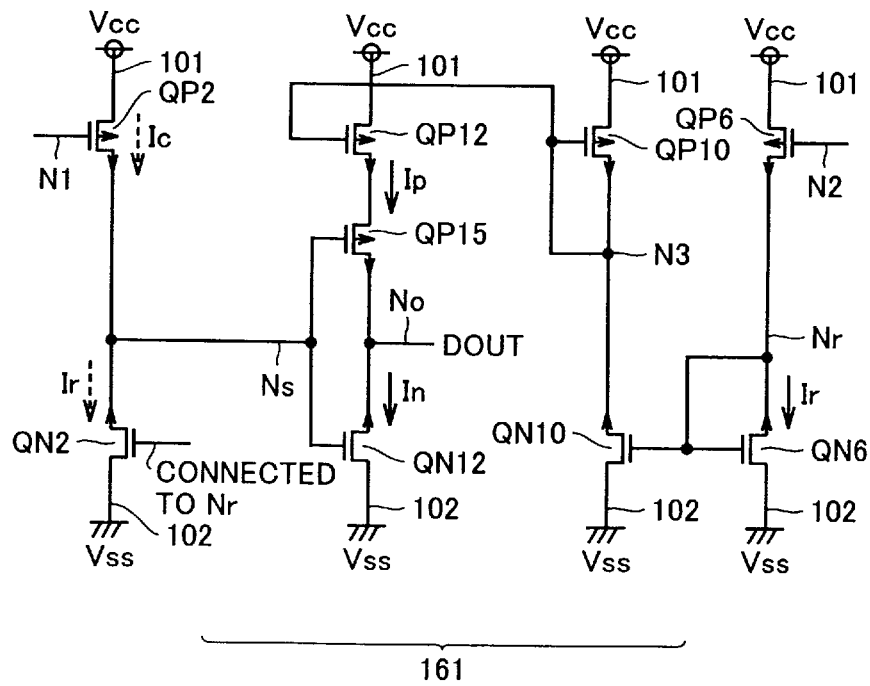
FIG. 6 is a circuit diagram showing another configuration example of the output level setting circuit.

Referring to FIG. 6, the output level setting circuit 161 is different from the output level setting circuit 160 shown in FIG. 4 in the point that it further has a P type transistor QP15.

The P type transistor QP15 is electrically connected to the P type transistor QP12 in series between the output node No wherein the output signal DOUT is generated and the power supply node 101. The gate of the P type transistor QP15 is connected to the node Ns.

In such a configuration in the case that the output signal DOUT is set at the L level, that is to say, in the case that the memory cell current Icell is larger than the reference current Iref, it becomes possible to cut off the current which penetrates and flows through the P type transistor QP12. Thereby, the power consumption in the output level setting circuit can be reduced.

Second Embodiment

Figure 7:
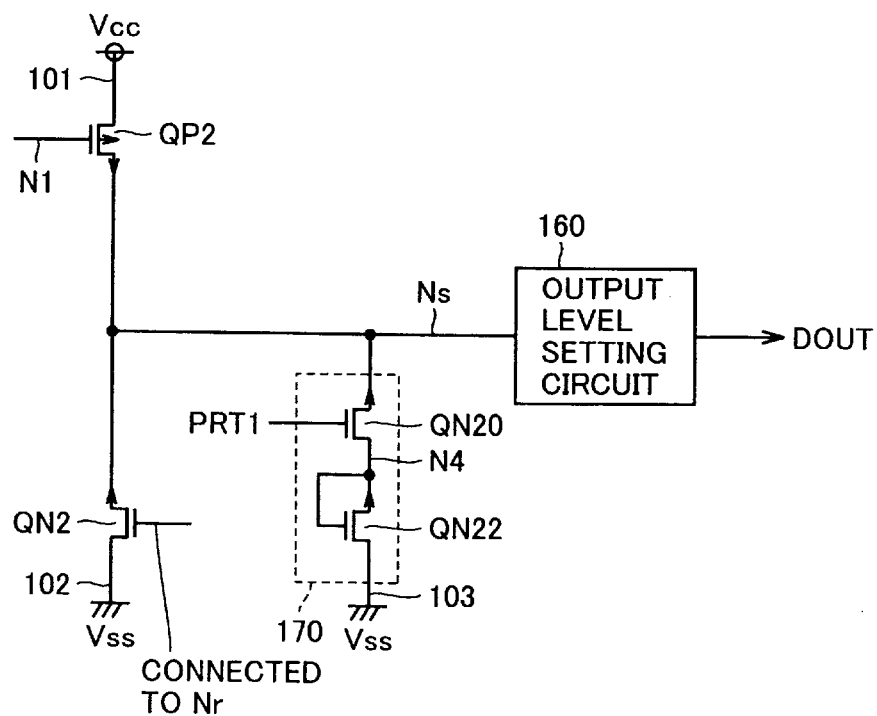
FIG. 7 is a circuit diagram for describing the configuration of a sense amplification circuit according to a second embodiment of the present invention.

FIG. 7 shows a configuration of a part within a sense amplifier circuit according to the second embodiment which is different from that in the sense amplifier circuit 100 according to the first embodiment.

Referring to FIG. 7, the sense amplifier circuit according to the second embodiment further includes a preset circuit 170 which is connected between the node Ns and the preset power supply node 103 in addition to the configuration of the sense amplifier circuit 100 according to the first embodiment.

The preset circuit 170 has N type transistors QN 20 and QN22 which are electrically connected in series between the node Ns and the preset power supply node 103. Though the setting of the voltage supplied by the preset power supply node 103 is described below, the preset power supply node 103 supplies the ground voltage Vss in the configuration of FIG. 7.

The N type transistor QN20 is electrically connected between the node Ns and the node N4 and a preset control signal PRT1 is inputted to the gate thereof. The N type transistor QN20 functions as a current switch which turns on in response to the activation (H level) of the preset control signal PRT1.

The N type transistor QN22 is electrically connected between the node N4 and the preset power supply node 103 and has a gate which is connected to the node N4. The N type transistor QN22 forms a current path between the node Ns and the preset power supply node 103 in the case that the N type transistor QN20 turns on.

The configuration of the other parts of the sense amplifier circuit according to the second embodiment including the parts which are not shown in FIG. 7 are the same as in the sense amplifier circuit 100 shown in FIG. 1, of which the detailed descriptions are not repeated.

Again referring to FIG. 5B, the sense amplifier circuit according to the embodiment of the present invention is in the condition where the voltage Vs of the node Ns is greatly affected by the power supply voltage Vcc due to the fact that the memory cell current Icell is larger than the reference current Iref during the charging period after the data read out is started.

Accordingly, in the case that the memory cell current Icell is smaller than the reference current Iref and the voltage of the node Ns during the sensing period is set on the ground voltage Vss end (in the case that the output signal DOUT is set at the H level) there is a problem that the amount of time required for the data read out becomes great.

Figure 8:
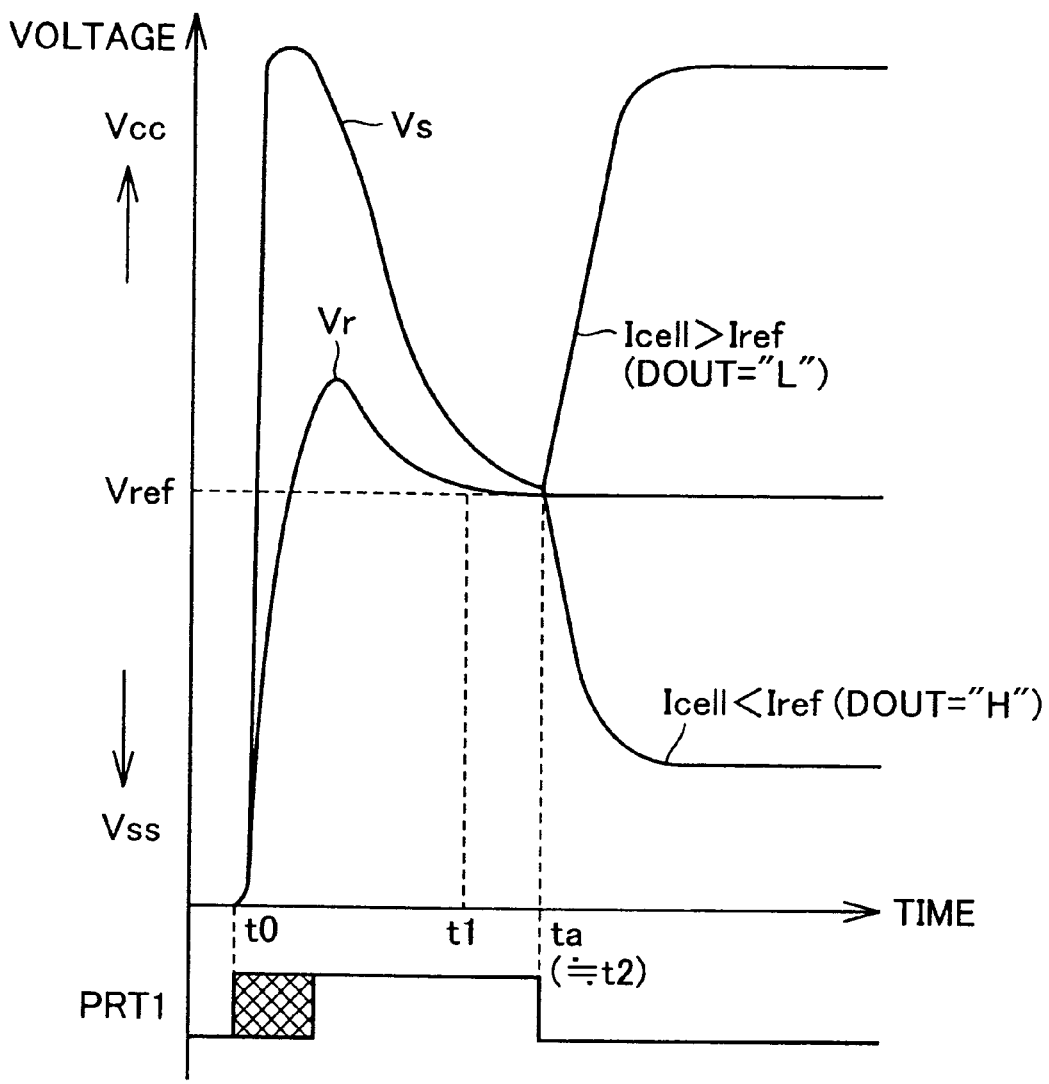
FIG. 8 is a diagram for describing data read out in the sense amplification circuit according to the second embodiment.

Referring to FIG. 8, the preset control signal PRT1 is activated at the H level for a predetermined period during the charging period shown in FIG. 5A beginning at the time t0 when the data read out is started. In accordance with this, the preset circuit 170 forcefully changes the voltage of the node Ns in such a manner so as to approach a predetermined voltage Vref, which is a constant value of the reference voltage Vr. Hereinafter, such an operation of the preset circuit 170 is also referred to as the "preset operation."

Thereby, even during the charging period when the memory cell current Icell is larger than the reference current Iref, the node Ns is connected to the preset power supply node 103 by the preset circuit 170 so as to lower the voltage Vs and, thereby, the voltage of the node Ns can be made to approach the predetermined reference voltage Vref at the same time that the memory cell current Icell approaches the constant value.

As a result of this, the level setting of the output signal DOUT in the output level setting circuit 160 can be carried out at a high speed particularly in the case of the setting at the L level.

In the sense amplifier circuit, which is shown as a representative example in the present embodiment, corresponding to the fact that the voltage of the node Ns before the sensing period, that is to say, during the charging period, is higher than the predetermined reference voltage Vref, the supply voltage of the preset power supply node 103, which corresponds to the preset circuit 170, is set as the ground voltage Vss. In this manner, the supply voltage of the preset power supply node 103 may be set in accordance with the relationship between the voltage of the node Ns and the reference voltage Vref before the sensing period.

In addition, the time ta, which is the time when the preset operation by the preset circuit 170 is completed, may be set to correspond to the time t2, which is the time when the memory cell current Icell converges to a constant value, so that the preset control signal PRT1 is deactivated to the L level at the time ta and after.

The period when the preset control signal PRT1 is activated can be set in accordance with the simulation analysis result or the like of the voltage shift of the node Ns. For example, the activation period of the preset control signal PRT1 can be set corresponding to the elapsed time from the time t0 when the data read out is activated due to the activation of the enable signals /EN1 and /EN2 by using a timer or the like.

Here, though the circuit configuration becomes complicated, it is possible to set the inactivation timing of the preset control signal PRT1 by comparing the voltage of the node Ns with the predetermined reference voltage Vref.

Third Embodiment

Figure 9:
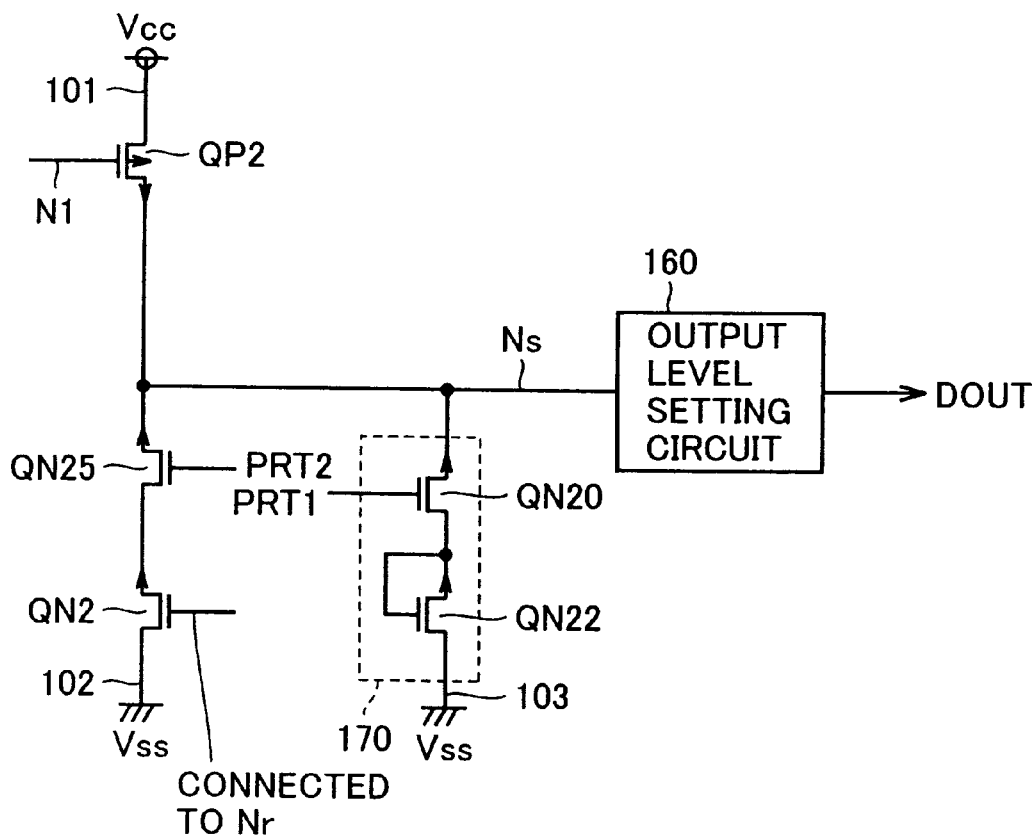
FIG. 9 is a circuit diagram for describing the configuration of a sense amplification circuit according to a third embodiment of the present invention.

Referring to FIG. 9, the configuration of a sense amplifier circuit according to the third embodiment is different from that of the sense amplifier circuit according to the second embodiment shown in FIG. 7 in the point that it further has an N type transistor QN25 which is electrically connected to the N type transistor QN2 in series between the node Ns and the ground node 102.

A preset control signal PRT2 is inputted to the gate of the N type transistor QN25. The N type transistor QN25 operates as a current switch which turns on/off in response to the activation (H level)/inactivation (L level) of the preset control signal PRT2.

In the sense amplifier circuit according to the second embodiment shown in FIG. 7, an N type transistor QN2 is connected in parallel to the preset circuit 170 between the node Ns and the ground node 102 during the activation period of the preset control signal PRT1. Accordingly, in the case that the activation period of the preset control signal PRT1 is lengthened in order to preset the node Ns sufficiently, the possibility arises that the node Ns is lowered to a level lower than the level originally desired to be preset, that is to say, the reference voltage Vref.

When the preset control signal PRT1 is once inactivated, however, the voltage of the node Ns starts rising again and, therefore, it becomes difficult to increase the speed of data read out in this case.

Accordingly, in the configuration according to the third embodiment, an N type transistor QN25 which functions as a current switch is provided in series to the N type transistor QN2 for controlling the N type transistors QN20 and QN25 so that both of them do not turn on.

Thereby, the N type transistors QN2 and QN22 are connected in parallel to the node Ns so that the phenomenon where the voltage of the node Ns lowers excessively during the preset operation can be prevented. As a result of this, the preset operation is effectively carried out prior to the sensing period when the memory cell current Icell converges to a constant level and, thereby, an increase in the speed of data read out can be achieved.

The other parts of the configuration of the sense amplifier circuit according to the third embodiment including the parts which are not shown in FIG. 9 are the same as in the sense amplifier circuit according to the second embodiment shown in FIGS. 1 and 7, of which the detailed descriptions are not repeated.

Figure 10:
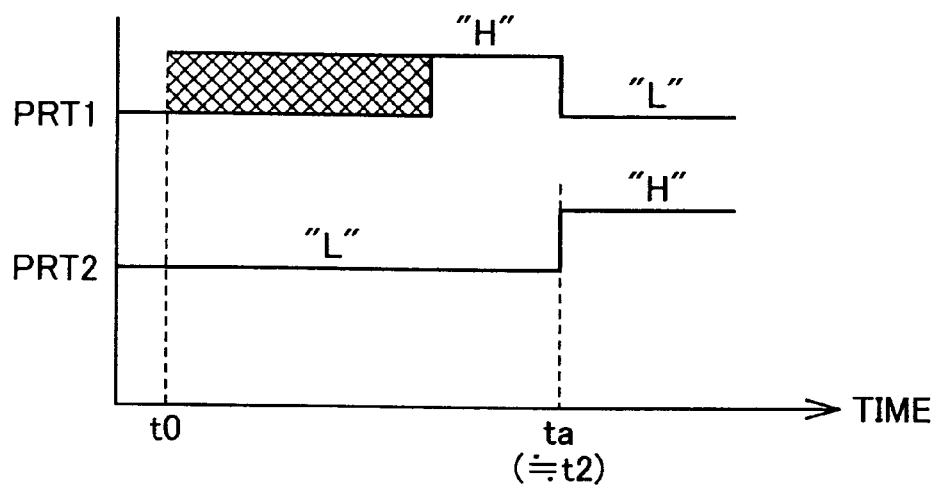
FIG. 10 is a timing chart for describing the setting of a preset control signal according to the third embodiment.

Referring to FIG. 10, the preset control signals PRT1 and PRT2 are controlled so as not to be activated (H level) at the same time during the preset operation. More concretely, the preset control signal PRT2 is maintained in the inactivation condition (L level) in order to turn off the transistor switch QN25 during the charging period. On the other hand, the preset control signal PRT1 makes the voltage of the node Ns approach the reference voltage Vref and, therefore, is activated to the H level for the predetermined period described in FIG. 8.

After the completion of the preset operation, that is to say, after the charging period, the preset control signals PRT1 and PRT2 are, respectively, inactivated (L level) and activated (H level). Accordingly, during the sensing period shown in FIG. 5B, the node Ns and the preset power supply node 103 are electrically disconnected so that the data read out operation is carried out in the configuration similar to that of the sense amplifier circuit 100 shown in the first embodiment.

Fourth Embodiment

Figure 11:
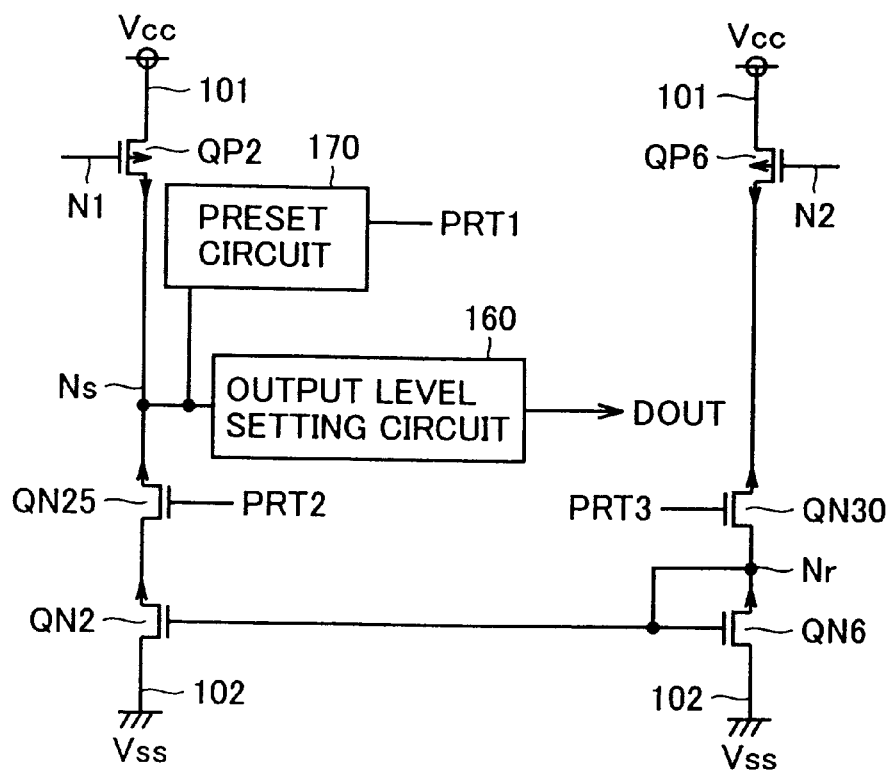
FIG. 11 is a circuit diagram for describing the configuration of a sense amplification circuit according to a fourth embodiment of the present invention.

Referring to FIG. 11, the configuration of a sense amplifier circuit according to the fourth embodiment is different from that of the sense amplifier circuit according to the third embodiment shown in FIG. 9 in the point that it further has an N type transistor QN30 which functions as a current switch for interrupting the internal current Ir which flows through the node Nr.

The N type transistor QN30 is electrically connected between the node Nr and the P type transistor QPG and a preset control signal PRT3 is inputted to the gate thereof. The N type transistor QN30 operates as a current switch which turns on/off in response to the activation/inactivation of the preset control signal PRT3.

Accordingly, the N type transistor QN30 interrupts the current path between the node Nr and the power supply node 101 in accordance with the inactivation (L level) of the preset control signal PRT3.

As is already described, the reference current Iref is also in a transitional condition in the same manner as the memory cell current Icell during the charging period immediately after the start of data read out. Accordingly, in this condition, the reference voltage Vr which is generated by the reference voltage generation part 140 cannot be set at the predetermined reference voltage Vref. Accordingly, even in the case that the current which flows through the node Nr is interrupted during this period, no interference is caused in the data read out, but rather, the effect is gained where a wasteful power consumption is cut down.

Figure 12:
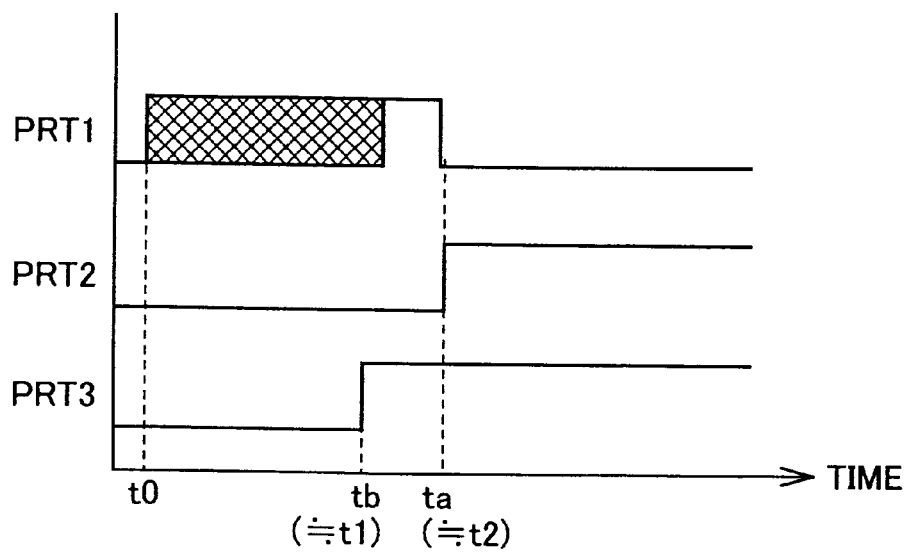
FIG. 12 is a timing chart for describing the setting of a preset control signal according to the fourth embodiment.

Referring to FIG. 12, the preset control signals PRT2 and PRT3 are set in the activation condition (H level) while the preset control signal PRT1 is required to be inactivated at the time ta, corresponding to the data sensing period after the preset completion, and after. Thereby, the sense amplifier circuit according to the fourth embodiment can carry out data read out in accordance with the same configuration and operation as of the sense amplifier circuit 100 shown in FIG. 1.

During the charging period before the sensing period, the preset control signal PRT3 is deactivated (L level) for a certain period of time which corresponds to the transitional condition of the reference current Iref and, after that, is activated to the H level at the time tb, according to the timing before the preset control signal PRT1. The time tb may be set so as to correspond to the time t1 when the reference current Icell converges to a constant value.

In response to this, during the period where the memory cell current Icell and the reference current Iref are both in the transitional condition, the N type transistors QN25 and QN30 are turned off by means of the inactivation (L level) of the preset control signals PRT2 and PRT3.

In such a configuration, during the charging period, the current which flows through the N type transistors QN2 and QN6 can be cut off so that the reduction of the power consumption can be achieved.

In addition, as a result of designing the transistor characteristics of the N type transistors QN25 and QN30 to behave in the same manner, the voltage drops in these transistors are set at the same level and, thereby, the precision of data read out can be maintained without shifting the output threshold in the data read out. Or, by designing the transistor size ratio to be QN25:QN2=QN30:QN6, the same effects can be gained.

In addition, in the case that the preset circuit 170 which operates according to the preset control signal PRT1 is provided for the node Ns, the voltage of the node Ns can be approached to the predetermined reference voltage Vref prior to the sensing period so that the speed of data read out can be increased.

The other parts of the configuration of the sense amplifier circuit according to the fourth embodiment, including the parts which are not shown in FIG. 11, are the same as of the sense amplifier circuit according to the third embodiment shown in FIGS. 1 and 9, of which the detailed descriptions are not repeated.

Fifth Embodiment

In the fifth embodiment, the case is assumed wherein one sense amplifier circuit has a plurality of sense input nodes for inputting comparison objective data, which correspond to the memory cell current Icell in the present embodiment, so as to generate a plurality of output signals, which correspond to the memory cell currents (comparison objectives) flowing through the respective sense input nodes. In this case, the reference memory cell which generates the reference current Iref that is used as the reference value for comparison is shared among the above described plurality of sense input nodes.

Figure 13:
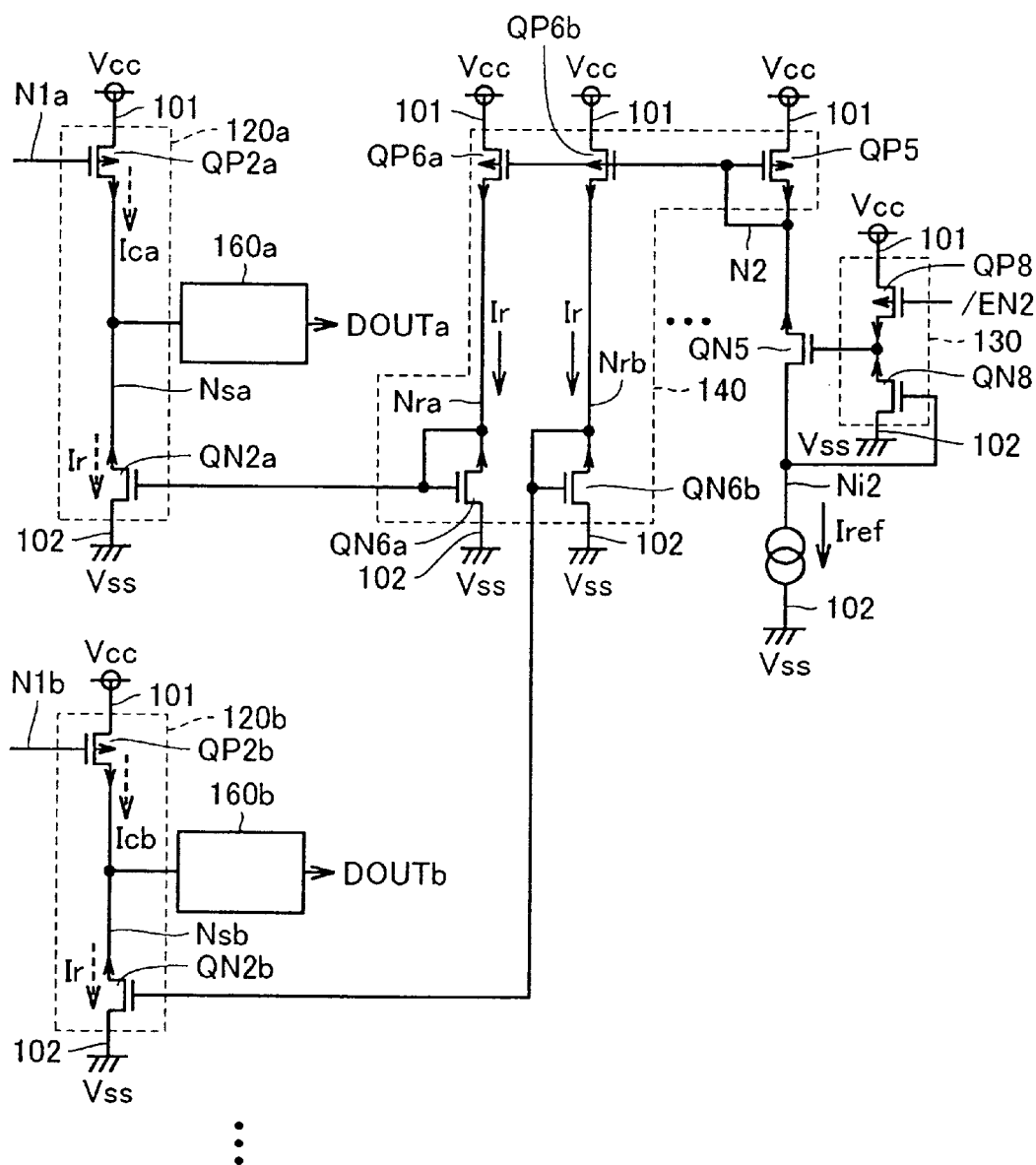
FIG. 13 is a circuit diagram for describing the configuration of a sense amplification circuit according to a fifth embodiment of the present invention.

In FIG. 13, configurations which, respectively, correspond to the first and the second sense input nodes representatively are shown and the configuration according to the fifth embodiment can be applied to the case where a single reference memory cell is shared for a plurality of arbitrary memory cell currents (comparison objectives).

In FIG. 13, the configuration in the stages prior to the current comparison part 120 is not shown. In addition, the same current comparison part 120 (P type transistor QP2 and N type transistor QN2) and the same output level setting circuit 160 as in FIGS. 1 and 4 are provided to correspond to the respective sense input nodes.

In the following FIG. 13, the same components as the circuits, or the like, described in the first to fourth embodiments, which are arranged so as to correspond to the first and the second since input nodes, respectively, are denoted by attaching the letters a and b, respectively. For example, the output level setting circuits which correspond to the first and the second sense input nodes, respectively, are denoted by the signs 160a and 160b, respectively, and the respective configurations and operations are the same as in the output level setting circuit 160 shown in FIG. 4.

Accordingly, the current comparison part 120a amplifies the difference between the memory cell current which flows through the first sense input node and the reference current Iref so as to reflect it in the voltage of the node Nsa. The output level setting circuit 160a sets the level of the output signal DOUTa in accordance with the voltage of the node Nsa.

In the same manner, the current comparison part 120b amplifies the difference between the memory cell current which flows through the second sense input node and the reference current Iref so as to reflect it in the voltage of the node Nsb. The output level setting circuit 160b sets the level of the output signal DOUTb in accordance with the voltage of the node Nsb.

The reference current Iref is a current fixed at a predetermined design value and, therefore, a single reference memory cell can be used for the comparison with currents which flow through a plurality of sense input nodes.

In the sense amplifier circuit according to the fifth embodiment, the node Nr which generates the reference voltage Vr is provided independently so as to correspond to each of the plurality of sense input nodes and the reference voltage Vr is generated independently for each of those nodes Nra, Nrb, . . . by means of the reference voltage generation part 140 and, thereby, the stability of the data read out is achieved.

In FIG. 13, the configurations corresponding to the first and the second sense input nodes within the reference voltage generation part 140 are shown in a representative manner.

In the reference voltage generation part 140, the P type transistor QP5 which forms one of the current mirrors is shared among a plurality of sense input nodes. On the other hand, the P type transistor QP6 which forms the other of the current mirrors, the node Nr and the N type transistor QN6 for generating the reference voltage Vr are provided to correspond to each of the plurality of sense input nodes. That is to say; corresponding to the first sense input node, a P type transistor QP6a, a node Nra and an N type transistor QN6a are provided while corresponding to the second sense input node, a P type transistor QP6b, a node Nrb and an N type transistor QN6b are provided.

The respective current driving performances (transistor sizes) of each of the P type transistors QP6a and QP6b as well as each of the N type transistors QN6a and QN6b are designed in the same manner as of the P type transistor QP6 and the N type transistor QN6 shown in FIG. 1, respectively.

In such a configuration, the internal currents which flow through the nodes Nra and Nrb, respectively, can be set at a common value in accordance with the reference current Iref which flows through the reference memory cell transistor MCRT.

In this manner, by generating the reference voltage Vr corresponding to each of the plurality of sense input nodes, the voltage level of each of the nodes Nra, Nrb, . . . can be prevented from fluctuating by being affected by the coupling capacitances which exist between the sources and drains of the N type transistors QN2a, QN2b, . . . which carry out the amplification operations.

On the contrary, in the case that a single node Nr is shared by a plurality of sense input nodes, the amplification operations in the N type transistors QN2a, QN2b, . . . corresponding to the respective sense input nodes influence each other so that the reference voltage Vr fluctuates. As a result of this, there is a risk that the data read out cannot be stably carried out.

Accordingly, by generating the reference voltage Vr in an independent node which is provided to correspond to each of a plurality of sense input nodes, it becomes possible to stably carry out the data read out even in the case that a single reference memory cell transistor is shared among a plurality of memory cell transistors for the data read out.

Here, in the present embodiment, although a sense amplifier circuit which is applied in a non-volatile semiconductor memory device is representatively shown as a signal amplification circuit according to the present invention, the application of the present invention is not limited to such a case. That is to say, a signal amplification circuit according to the present invention can be applied in a semiconductor memory device which has a configuration where data read out is carried out through a current comparison regardless of the volatility/non-volatility of the data storage. In addition, the application of the present invention to a variety of electronic circuits, as a circuit for sensing the difference between currents, is possible.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A signal amplification circuit for amplifying and sensing a difference between an input current and a reference current which flow a first and a second input nodes, respectively, comprising:
    a reference voltage generation part for generating a reference voltage at a first node in accordance with said reference current;
    a first transistor of a first conductive type being electrically connected between a first power supply node that supplies a first voltage and said first input node so as to allow said input current to pass through;
    a current comparison part for generating a voltage at a second node in accordance with a difference between said input current and said reference current based on said reference voltage,
    said current comparison part including
        a second transistor of said first conductive type being electrically connected between said first power supply node and said second node and forming a current mirror with said first transistor and
        a third transistor of a second conductive type which is the opposite conductive type of said first conductive type,
        said third transistor having a control electrode which receives an input of said reference voltage and being electrically connected between a second power supply node that supplies a second voltage and said second node; and
    an output level setting part for outputting a voltage corresponding to a sensing result to an output node, in accordance with a voltage of said second node,
    said output level setting part includes
        a fourth transistor of said first conductive type being electrically connected between said first power supply node and said output node and having a control electrode which receives a voltage in accordance with said reference voltage, and
        a fifth transistor of said second conductive type being electrically connected between said output node and said second power supply node and having a control electrode connected to said second node;
    wherein currents which flow through said fourth and fifth transistors, respectively, are in balance in the condition where said input current and said reference current are equal.

2. The signal amplification circuit according to claim 1, wherein the transistor sizes of said second and third transistors are designed so that said second and third transistors operate in saturated regions.

3. The signal amplification circuit according to claim 1, wherein
    said output level setting part further includes a control voltage generation part for supplying the voltage in accordance with said reference voltage to the control electrode of said fourth transistor,
    said control voltage generation part includes:
        a sixth transistor of said second conductive type which is electrically connected between a third node that is connected to the control electrode of said fourth transistor and said second power supply node and which has a control electrode connected to said first node; and
        a seventh transistor of said first conductivity type which is electrically connected between said third node and said first power supply node and which has a control electrode connected to said third node, and wherein the ratio of the current driving performance of said third transistor to the fifth transistor and the ratio of the current driving performance of said seventh transistor to said fourth transistor are the same.

4. The signal amplification circuit according to claim 1, wherein said output level setting part further includes a sixth transistor of said first conductive type which is electrically connected to said fourth transistor in series between said first power supply node and said output node and which has a control electrode connected to said second node.

5. The signal amplification circuit according to claim 1, further comprising a preset part which is arranged between said second node and a preset power supply node and which allows the voltage of said second node to approach said reference voltage during a predetermined period before the output of said sensing result, wherein said preset part electrically connects said second node to said preset power supply node during said predetermined period.

6. The signal amplification circuit according to claim 5, wherein
    said preset power supply node supplies said second voltage,
    said current comparison part further includes a current switching part which is electrically connected to said third transistor in series between said second node and said second power supply node and which turns off at least during said predetermined period, and
    said current switching part turns on after said predetermined period.

7. The signal amplification circuit according to claim 1, wherein
    said input current and said reference current are conveyed to said first and second input nodes, respectively, through a first and a second current transmission paths,
    said first and second current transmission paths have first and second parasitic capacitances, respectively, said current comparison part further includes a first current switch part which is electrically connected to said third transistor, in series, between said second node and said second power supply node and which is turned off until a first time, which is set in accordance with the timing when said input current converges in a constant level, said reference voltage generation part includes:
  current supply parts for generating an internal current in accordance with said reference current at said first node;
  a voltage generation part for generating a voltage in accordance with said internal current at said first node as said reference voltage; and
  a second current switch part which is connected to said current supply part and said voltage generation part, in series, and which is turned off in order to cut off said internal current until a second time, which is set in accordance with the timing when said reference current converges in a constant level,
  said first current switch part turns on after said first time; and
  said second current switch part turns on after said second time.

8. The signal amplification circuit according to claim 7, wherein:
  said current supply parts has
    a sixth transistor of said first conductive type for allowing said reference current to pass which is electrically connected between said first power supply node and said second input node and
    a seventh transistor of said first conductive type which is electrically connected between the first power supply node and said first node and which forms a current mirror with said sixth transistor;
  said voltage generation part has an eighth transistor which has a control electrode connected to said first node and is electrically connected between said second power supply node and said first node;
  said first current switch part has a ninth transistor of said second conductive type which is electrically connected to said third transistor, in series, between said second node and said second power supply node and which is turned off until said first time;
  said second current switch part has a tenth transistor of said second conductive type which is connected, in series, to said current supply part and said voltage generation part and which is turned off until said second time; and
  the ratio of the current driving performance of said tenth transistor to said eighth transistor and the ratio of the current driving performances of said ninth transistor to said third transistor are the same.

9. The signal amplification circuit according to claim 7, further comprising a preset part, which is arranged between said second node and the preset voltage node, for making the voltage of said second node closer to said reference voltage during a predetermined period, wherein:
  said predetermined period is set to a time, which is previous to outputting said sensing result, before said first time; and
  said preset part electrically connects said second node to said preset power supply node during said predetermined period and electrically disconnects said second node from said preset power supply node after said predetermined period.

10. The signal amplification circuit according to claim 7, wherein, in the case that said first and second current switch parts turn on, voltage drops which occur in said first and second current switch parts are, respectively, the same.

11. The signal amplification circuit according to claim 1, wherein:
  said signal amplification circuit comprises a plurality of said first input nodes;
  said second input node is shared by said plurality of first input nodes;
  said current comparison part, said output level setting circuit and said first node are independently provided according to the number in the plurality so as to correspond to said plurality of first input nodes, respectively; and
  said reference voltage generation part independently generates said reference voltage in each of the plurality of first nodes.

12. A semiconductor memory device comprising:
  a plurality of memory cells through one of which a current amount in accordance with the level of storage data is made to flow at the time of data read out;
  a reference memory cell through which a current amount which becomes the reference for said data read out is made to flow;
  a selection part for electrically connecting one of said plurality of memory cells selected as an objective of the data read out and said reference memory cell to first and second sense input nodes, respectively, at the time of said data read out; and
  a sense. amplifier circuit for amplifying and sensing the difference between an input current and a reference current which flow through said first and second sense input nodes, respectively, wherein said sense amplifier circuit includes:
    a reference voltage generation part for generating a reference voltage at a first node in accordance with said reference current;
    a first transistor of a first conductive type, which is electrically connected between a first power supply node that supplies a first voltage and said first input node, for allowing said input current to pass; and
    a current comparison part for generating a voltage in accordance with the difference between said input current and said reference current at a second node based on said reference voltage, wherein
  said current comparison part has:
    a second transistor of said first conductive type which is electrically connected between said first power supply node and said second node and which forms a current mirror with said first transistor; and
    a third transistor of a second conductive type which is the opposite conductive type to said first conductive type, which has a control electrode for receiving an input of said reference voltage and which is electrically connected between a second power supply node that supplies a second voltage and said second node, wherein
    said sense amplifier circuit further includes an output level setting part for outputting read out data which has a voltage corresponding to a sensing result at an output node in accordance with a voltage of said second node, wherein
  said output level setting part has
    a fourth transistor of said first conductive type which is electrically connected between said first power supply node and said output node and which has a control electrode for receiving an input of a voltage in accordance with said reference voltage and
    a fifth transistor of said second conductive type which is electrically connected between said output node and said second power supply node and which has a control electrode connected to said second node, wherein
      currents which flow through said fourth and fifth transistors, respectively, are in balance under the condition where said input current and said reference current are equal.

* * * * *